(12) United States Patent
Ishikawa et al.

(10) Patent No.: US 8,216,379 B2
(45) Date of Patent: Jul. 10, 2012

(54) NON-CIRCULAR SUBSTRATE HOLDERS

(75) Inventors: Tetsuya Ishikawa, Saratoga, CA (US); Liang-Yuh Chen, Foster City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 527 days.

(21) Appl. No.: 12/428,869

(22) Filed: Apr. 23, 2009

(65) Prior Publication Data

US 2010/0273314 A1 Oct. 28, 2010

(51) Int. Cl.
*H01L 21/20* (2006.01)
*B23Q 3/18* (2006.01)

(52) U.S. Cl. .................. 118/728; 156/345.51; 269/303; 257/E21.09

(58) Field of Classification Search .................. 118/724, 118/725, 728; 156/345.52, 345.51; 269/303; 257/E21.09
See application file for complete search history.

(56) References Cited

U.S. PATENT DOCUMENTS

| | | | |
|---|---|---|---|
| 4,439,261 A | 3/1984 | Pavone et al. | |
| 4,566,726 A | 1/1986 | Correnti et al. | |
| 5,200,157 A * | 4/1993 | Toya et al. | 118/730 |
| 5,690,742 A * | 11/1997 | Ogata et al. | 118/500 |
| 6,143,082 A * | 11/2000 | McInerney et al. | 118/719 |
| 6,242,111 B1 | 6/2001 | Telford et al. | |
| 6,472,294 B2 | 10/2002 | Meuris et al. | |
| 6,508,883 B1 | 1/2003 | Tanguay | |
| 6,995,381 B2 | 2/2006 | Sheng | |
| 2005/0160991 A1 * | 7/2005 | Miyamoto et al. | 118/728 |
| 2006/0096635 A1 | 5/2006 | Tuttle | |
| 2007/0152353 A1 | 7/2007 | Park | |
| 2010/0162957 A1 * | 7/2010 | Boyd et al. | 118/725 |
| 2010/0273314 A1 * | 10/2010 | Ishikawa et al. | 438/478 |

* cited by examiner

*Primary Examiner* — Sylvia R. MacArthur
(74) *Attorney, Agent, or Firm* — Mark J. Danielson; Pillsbury Winthrop Shaw Pittman LLP

(57) ABSTRACT

A substrate holder comprises a generally circular planar body, the body having greater than or equal to two pairs of diametrically opposed, parallel flat edges, and wherein the substrate holder is configured to fit on a generally circular susceptor within a processing chamber. In some embodiments the substrate holder has four pairs of diametrically opposed, parallel flat edges, whereby the substrate holder is substantially octagonal. Furthermore, in some embodiments the substrate holder covers less than eighty percent of the susceptor area. A method of processing a substrate using the substrate holder includes: loading the substrate into a recess in the substrate holder; transferring the substrate holder through a loadlock into the processing chamber, the substrate holder being presented with a smallest cross-section aligned for passage through the loadlock; placing the substrate holder on the susceptor; and processing the substrate. The substrate holder may carry a plurality of substrates. Alternatively, the substrate holder may carry a single large substrate, the substrate being trimmed to fit the substrate holder.

23 Claims, 6 Drawing Sheets

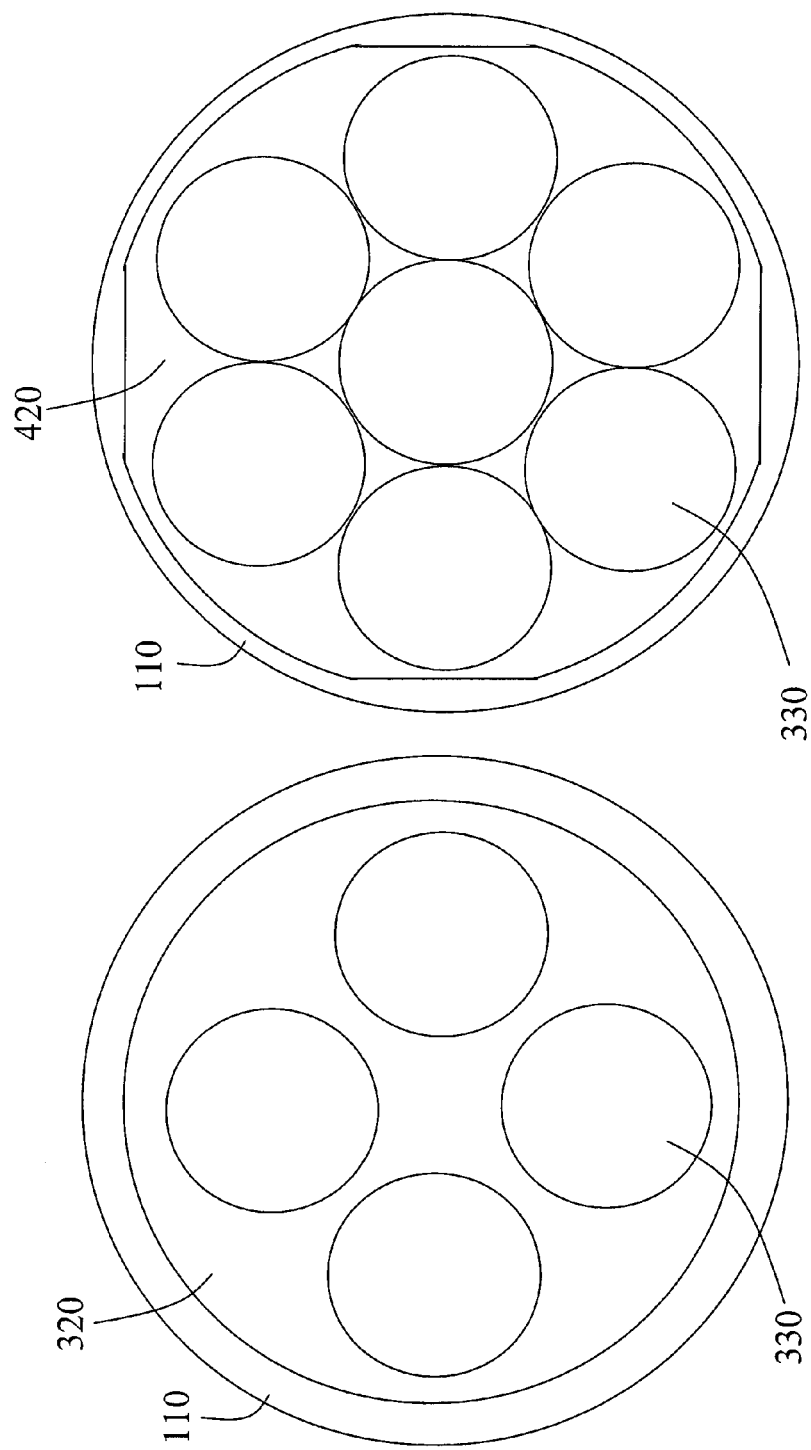

NON-CIRCULAR SUBSTRATE HOLDERS

FIELD OF THE INVENTION

The present invention relates generally to substrate holders and more specifically to substrate holders for carrying non-standard sized and shaped substrates through a semiconductor-type processing chamber.

BACKGROUND OF THE INVENTION

Many semiconductor-type process tools have a transfer passage, such as a loadlock, which limits the size and shape of substrates and substrate holders that can be inserted into the tool's process chamber. Many of these semiconductor-type process tools are optimized for processing of substantially circular substrates, such as 300 mm silicon wafers. However, there is a demand to use these process tools for substrates other than those that the tools were originally designed to process. For example, there is a demand to use these tools to process non-circular substrates. There is also a demand to process smaller diameter substantially circular substrates. Consequently, there is a need for substrate holders which can accommodate these differently sized and shaped substrates for processing in the aforementioned tools.

Devices such as multiple quantum well (MQW) light emitting diodes (LEDs) are fabricated on small substrates—typical 2, 3 or 4 inches in diameter. These devices may be gallium nitride (GaN) based. GaN based materials have historically been fabricated using metal organic chemical vapor deposition (MOCVD) or molecular beam epitaxy (MBE) processes. Recently, however, hydride/halide vapor phase epitaxy (HVPE) has been demonstrated as a viable alternative process. HVPE offers the possibility of high volume manufacturing (HVM) at low cost. However, to provide cost effective HVM solutions for fabricating such devices, there is a need to process the device substrates in batches on production-worthy processing tools. Consequently, there is a need for substrate holders optimized for carrying multiple small substrates. Furthermore, there is a need for such substrate holders to be compatible with the production-worthy processing tools and to be optimized for high throughput at high yield.

SUMMARY OF THE INVENTION

Embodiments of this invention are based on the concept of a generally circular substrate holder which is trimmed so as to allow the holder to pass through a size-limiting transfer passage into the processing chamber of a semiconductor-type process tool, while providing a larger surface area for carrying substrates than an untrimmed circular substrate holder that can also pass through the same transfer passage. The substrate holder may be configured to carry one or a plurality of wafers/substrates. Furthermore, the substrate holder may be configured to carry non-circular substrates. The substrate holder may be configured to carry a single large substrate, the substrate being trimmed to fit in the substrate holder.

Embodiments of this invention may provide a substrate holder compatible with production-worthy processing equipment. The substrate holder may be compatible with hydride/halide vapor phase epitaxy. Furthermore, the substrate holder may be compatible with processing equipment designed for semiconductor processing of large single wafers, such as 300 mm wafers. The concepts and methods of this invention allow for cost effective high volume manufacturing of semiconductor devices such as multiple quantum well light emitting diodes and power devices.

According to aspects of this invention, a substrate holder comprises a generally circular planar body, the body having greater than or equal to two pairs of diametrically opposed, parallel flat edges, and wherein the substrate holder is configured to fit on a generally circular susceptor within a processing chamber. In some embodiments, the substrate holder has four pairs of diametrically opposed, parallel flat edges, whereby the substrate holder is substantially octagonal. Furthermore, in some embodiments the substrate holder covers less than eighty percent of the susceptor area.

According to further aspects of this invention, a method of processing a substrate using the substrate holder includes: loading the substrate into a recess in the substrate holder; transferring the substrate holder through a loadlock into the processing chamber, the substrate holder being presented with a smallest cross-section aligned for passage through the loadlock; placing the substrate holder on the susceptor; and processing the substrate.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIG. 3 shows a 300 mm diameter substrate holder for four 4 inch wafers;

FIG. 4 shows a 325 mm diameter substrate holder with trimmed edges for seven 4 inch wafers, according to embodiments of the invention;

DETAILED DESCRIPTION

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and viceversa, unless explicitly stated otherwise herein. Moreover, applicants do not intend: for any term in the specification or claims to be ascribed an uncommon or special meaning unless explicitly set forth as such. Further, the present invention encompasses present and future known equivalents to the known components referred to herein by way of illustration.

In general, embodiments of this invention are based on the concept of a generally circular substrate holder which is trimmed so as to allow the holder to pass through a size-limiting transfer passage into the processing chamber of a semiconductor-type process tool, while providing a larger surface area for carrying substrates than an untrimmed circular substrate holder that can also pass through the same transfer passage. The substrate holder may be configured to carry a plurality of wafers/substrates. Alternatively, the substrate holder may be configured to carry a single large substrate, the substrate being trimmed to fit the substrate holder. The substrate holder may be configured to carry non-circular substrates. The concepts and methods of this invention may allow for cost effective high volume manufacturing of semiconductor devices such as multiple quantum well light emitting diodes and power devices.

Figure 1:
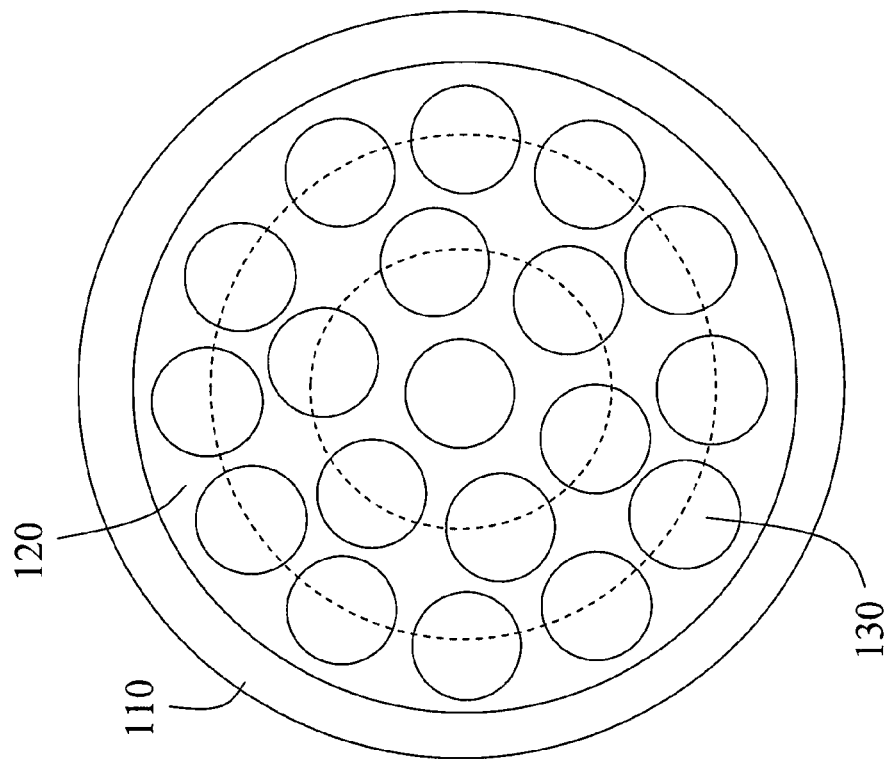
FIG. 1 shows a 300 mm diameter substrate holder for nineteen 2 inch wafers.

FIG. 1 shows a 300 mm diameter substrate holder 120 with nineteen 2 inch wafers/substrates 130. The substrate holder 120 is shown positioned on a 356 mm (14 inch) diameter susceptor 110. The susceptor 110 is a standard susceptor designed for 300 mm wafer processing. The concentric circles, shown by dashed lines in FIG. 1, show how the wafers 130 are arranged in the holder 120. The wafers 130 are arranged with their centers on the circles. A nineteenth wafer is shown in the center of the holder 120; however, in some processing chambers uniformity may be difficult to achieve in the very center of the holder and it may be advantageous to load only eighteen wafers in the holder, leaving the center position unfilled.

A susceptor 110 is a platform in a processing chamber which serves as a support for the substrate holder 120 and may also function to heat the substrate holder and to act as an electrode for generation of a plasma. Susceptors are commonly made of aluminum, see for example U.S. Pat. No. 6,421,111 to Telford et al. However, for extreme process conditions, more robust materials may be desired. For example, in high temperature applications the following materials may be used: silicon carbide, graphite, alumina, glass, ceramics, metals such as nickel-alloys and tungsten, and various composites. Susceptor 110 is generally circular, as designed for use with silicon wafers.

The substrate holder 120 in FIG. 1 has the advantage of being readily compatible with a processing tool designed for 300 mm wafers. However, substrate holder 120 does not optimize throughput.

Figure 2:
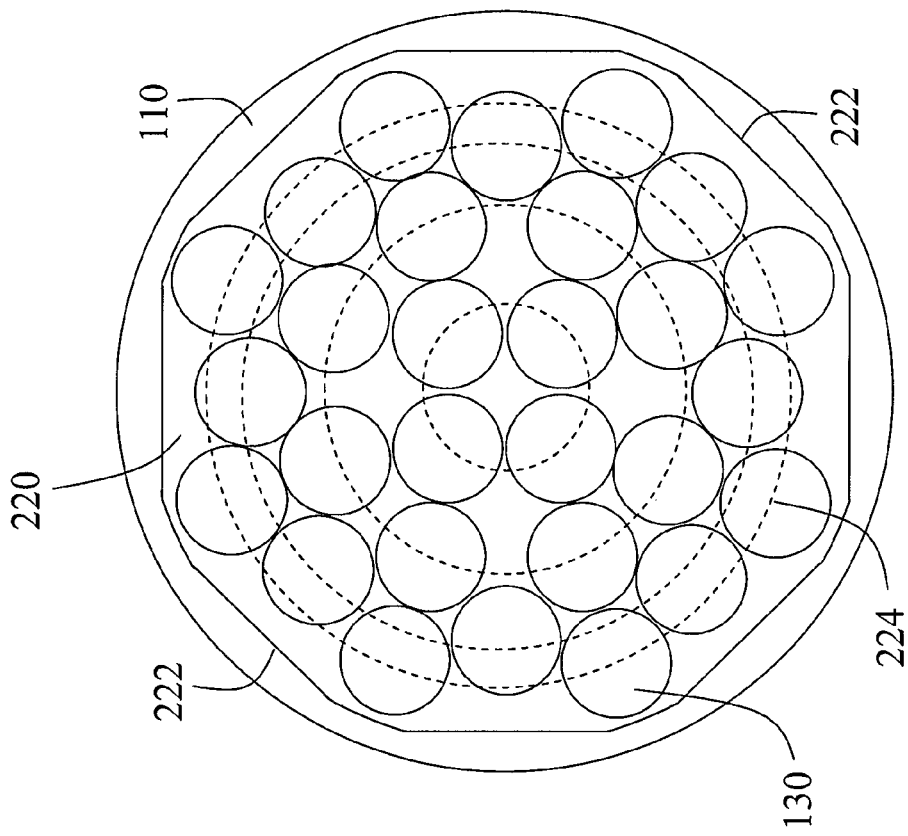
FIG. 2 shows a 325 mm diameter substrate holder with trimmed edges for twenty-eight 2 inch wafers, according to embodiments of the invention.
Figure 6:
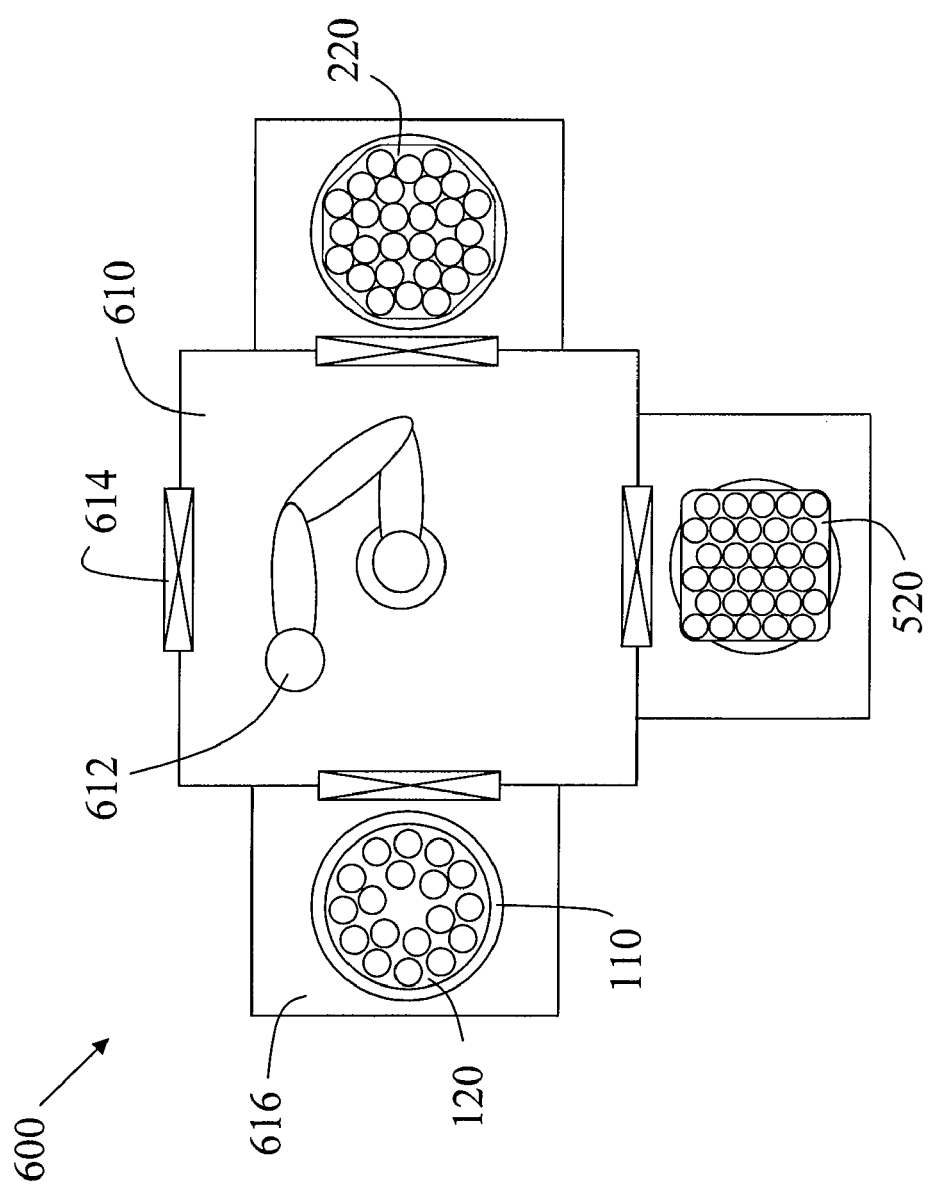
FIG. 6 is a schematic representation of substrate holders being used in a process tool, according to embodiments of the invention.

FIG. 2 shows a 325 mm diameter substrate holder 220 with trimmed edges for twenty-eight 2 inch wafers/substrates 130. The concentric circles 224, shown by dashed lines in FIG. 2, show how the wafers 130 are arranged in the holder 220. The wafers 130 are arranged with their centers on the circles 224—four wafers on the center-most circle, then 8 wafers on each of the other circles. The substrate holder 220 is shown with trimmed edges 222—there are eight cuts which together have reduced the total area of the holder 220. Due to the trimmed edges, the holder 220 occupies less than 80 percent of the susceptor area. This is a significant consideration when heating the holder, since the thermal mass of the trimmed holder is less than an untrimmed holder. Furthermore, the trimmed edges 222 may be in diametrically opposed and parallel pairs, as shown in FIG. 2. The diametrically-opposed edges provide smaller diameters for ease of passage through the limiting apertures in the processing system. For example, the distance between trimmed edges 222 is 310 mm, compared with the maximum diameter of the holder of 325 mm. Limiting apertures include loadlocks 614, as shown in FIG. 6.

Comparison of FIGS. 1 and 2 shows the potential for increasing throughput from 19 wafers per batch to 28 wafers per batch on the same processing tool, with an increase in the holder surface area of only approximately 12 percent.

FIG. 3 shows a 300 mm diameter substrate holder 320 for four 4 inch wafers/substrates 330. The substrate holder 320 is shown positioned on a 356 mm diameter susceptor 110. FIG. 4 shows a holder 420 with a significantly improved wafer handling capacity, compared with substrate holder 320. FIG. 4 shows a 325 mm diameter substrate holder 420 with trimmed edges for carrying seven 4 inch wafers/substrates 330. The substrate holder 420 has four trimmed edges which together reduce the total area of the holder. The trimmed edges may be in diametrically opposed and parallel pairs, as shown in FIG. 4. Furthermore, the number of cuts can be increased to six or eight. For example, eight cuts can be made, as shown in holder 220 in FIG. 2. The cuts provide smaller diameters for ease of passage through the limiting apertures in the processing system and also provide a reduced thermal mass for the holder.

Figure 5:
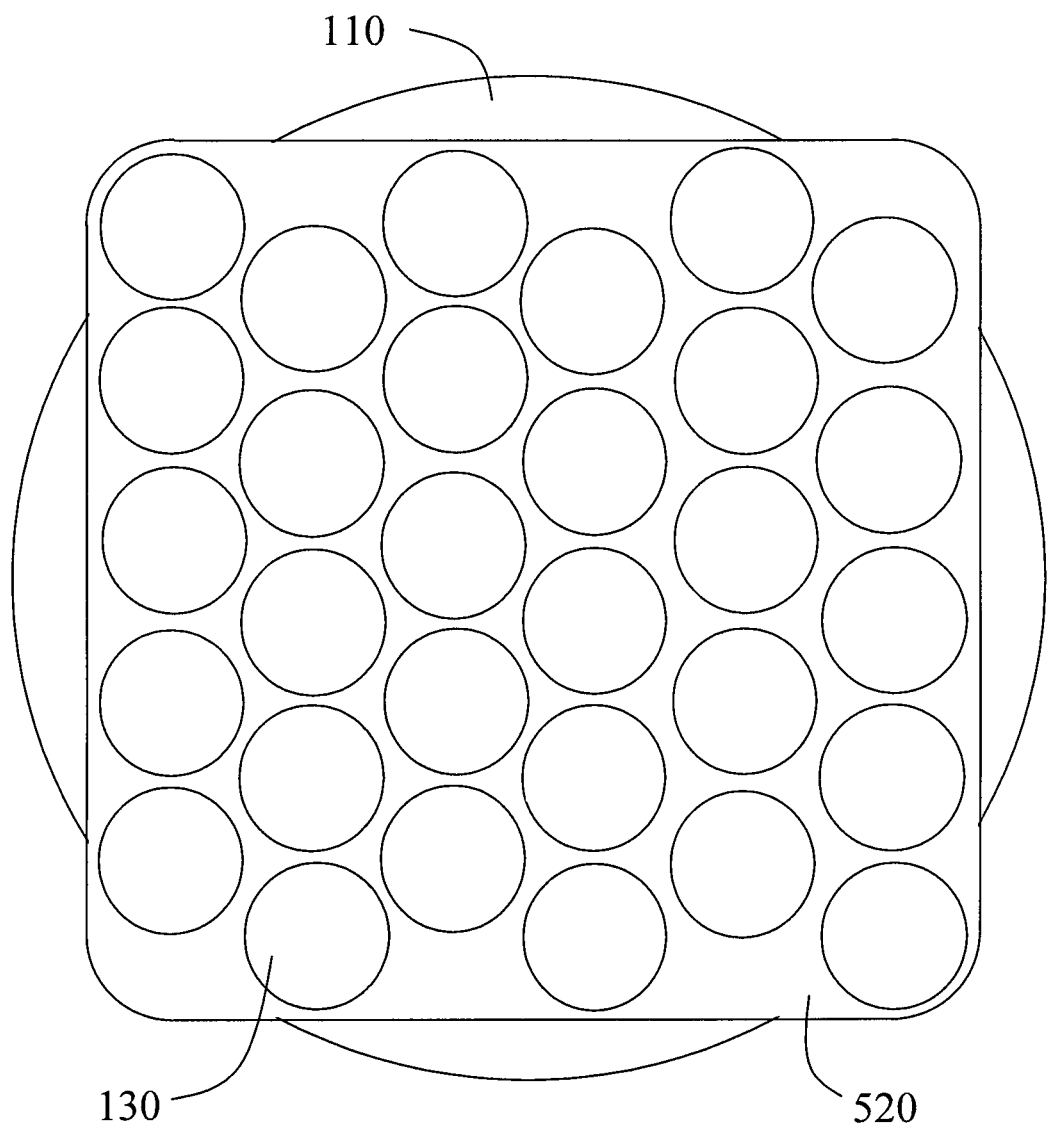
FIG. 5 shows a 300×300 $mm^2$ substrate holder for thirty 2 inch wafers, according to embodiments of the invention.

FIG. 5 shows a 300×300 mm$^2$ substrate holder 520 for thirty 2 inch wafers/substrates 130. The 300 mm dimensions allow for ease of passage through the limiting apertures of the processing system. The holder 520 has rounded corners, but does not fit on the 356 mm susceptor 110, as is clear from FIG. 5. The substrate holder 520 may have a larger wafer capacity than substrate holder 220, shown in FIG. 2. However, due to the holder extending beyond the edges of the susceptor, process uniformity problems may exist in the corner regions. Furthermore, the approximately 400 mm diagonal of the substrate holder 520 may be incompatible with standard 300 mm wafer process chambers in which the holder 520 is rotated during processing.

FIG. 6 shows a schematic representation of a multi-chambered process tool 600. FIG. 6 is used to illustrate the limiting apertures of typical processing tools and the way in which different substrate holders interact with such a tool. The tool 600 comprises: a central chamber 610 equipped with a substrate handling robot 612 and loadlocks 614; and processing chambers 616 each equipped with a susceptor 110. Three different substrate holders are shown: 300 mm substrate holder 120, 325 mm substrate holder 220 with trimmed edges, and 300×300 mm$^2$ substrate holder 520. The robot 612 is used to move the substrate holders in and out of the process chambers 616. The loadlocks 614 are designed for handling 300 mm diameter wafers. It is clear from FIG. 6 how the trimmed substrate holder 220 and the square holder 520 can be moved through the loadlocks 614 when the holders are properly aligned. It is also clear from FIG. 6 that substrate holders such as holder 520 have longest dimensions that are larger than the aperture through the loadlocks 614. Furthermore, substrate holders such as holder 220 may have dimensions that are larger than the aperture through the loadlocks 614. For example, if the loadlocks have an aperture of 320 mm, then holder 220 will only fit through the loadlock when the trimmed edges 222 are properly aligned to provide a 310 mm diameter cross-section, as discussed above with reference to FIG. 2.

Figure 7:
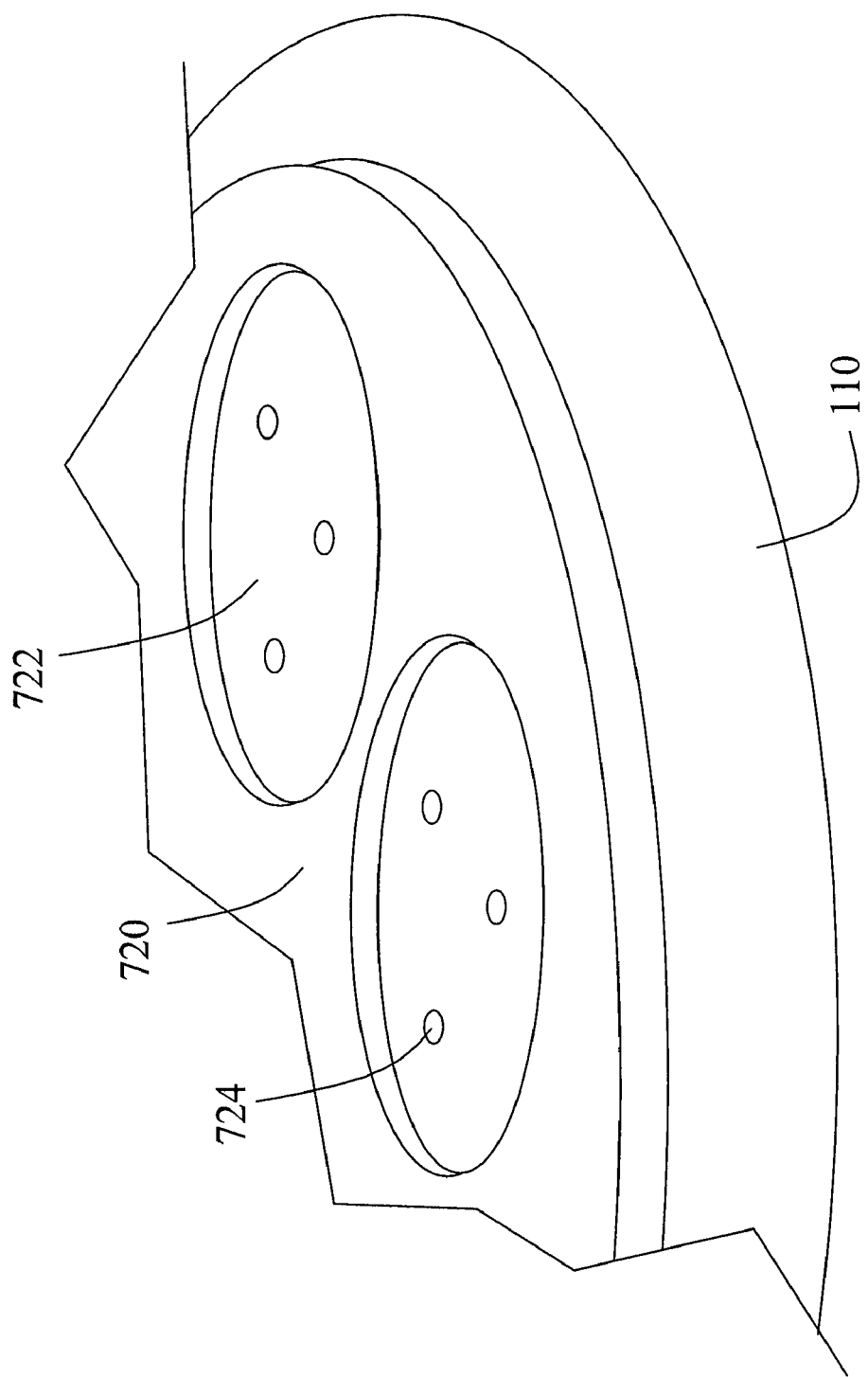
FIG. 7 shows a perspective view of a section of a substrate holder, according to embodiments of the invention.

FIG. 7 shows a perspective view of a part of a substrate holder 720 positioned on a susceptor 110. FIG. 7 shows recesses 722 in the substrate holder 720 for receiving the wafers/substrates. Each recess has apertures 724 for allowing lifting pins to be used to assist in removing wafers from the holder. Lifting pins (not shown) are inserted through apertures 724 from the back of the holder 720. Lifting pins are particularly useful when wafers are positioned very close together in a holder—wafers may be as close as 1 mm. However, when wafers are positioned further apart, wafers may be safely picked by a robot from the substrate holder without the use of lifting pins. As shown in FIG. 7, the thickness of the substrate holder is greater than the depth of the recess. For ease of illustration, trimmed edges are not shown on the substrate holder 720 in FIG. 7; however, substrate holder 720 may have trimmed edges, as described above in reference to FIGS. 2 and 4. A gap between the edge of the substrate holder 720 and the edge of the susceptor 110 may improve the uniformity of processing. Even though FIG. 7 shows a substrate holder with recesses for holding multiple substrates, the substrate holder may also be configured with a single recess, for holding a single substrate.

The substrate holders may be configured for chucking, to hold the wafers/substrates in place, as will be familiar to those skilled in the art. For example, vacuum suction through channels built into the substrate holder may be used to keep wafers in place in the substrate holder. Furthermore, vacuum chucking may be used to hold the substrate holder in place on the susceptor in the processing chamber.

The substrate holders are made of materials that are compatible with the wafer/substrate processing conditions. For example, to withstand the high temperatures and aggressive chemical environment associated with HVPE of gallium nitride, and to enable inductive heating of the holder, the holder can be made of graphite, coated with a protective layer of silicon carbide. If inductive heating is not used, then a wider range of materials may be used, including: silicon carbide, graphite, alumina, glass, ceramics, metals such as nickel-alloys and tungsten, and various composites.

Referring to FIGS. 1-8, a method of processing a substrate using the substrate holder (220, 420, 720), described above, includes: (i) loading the substrates 130 into a recess 722 in the substrate holder, the substrate holder being generally circular and having greater than or equal to two pairs of diametrically opposed, parallel flat edges 222; (ii) transferring the substrate holder through a loadlock 614, the substrate holder being presented with a smallest cross-section aligned for passage through the loadlock 614; (iii) placing the substrate holder on a susceptor 110; and (iv) processing the substrate. Processing may include HVPE of gallium nitride materials. During (iv)—the processing of the substrate—the substrate holder may be rotated. After (iv), the substrate holder may be removed from the susceptor 110 and transferred back through the loadlock 614. After the substrate holder is transferred back through the loadlock, the substrate may be removed from the substrate holder with the assistance of lifting pins inserted through apertures 724 in the bottom of the substrate holder. During (iv), the substrate holder may be inductively heated, as described above with reference to the susceptor. The holder may be configured to carry a plurality of substrates. Alternatively, the holder may be configured to carry a single large substrate, the substrate being trimmed to fit the substrate holder.

Further to the examples given above, substrate holders may be optimized for 200 mm and 450 mm production-worthy semiconductor process equipment. Holders may be designed with more than eight trimmed edges, particularly for larger format process equipment such as 450 mm process equipment. Holders may be designed to accommodate larger substrates, such as 5 inch wafers.

Figure 8:
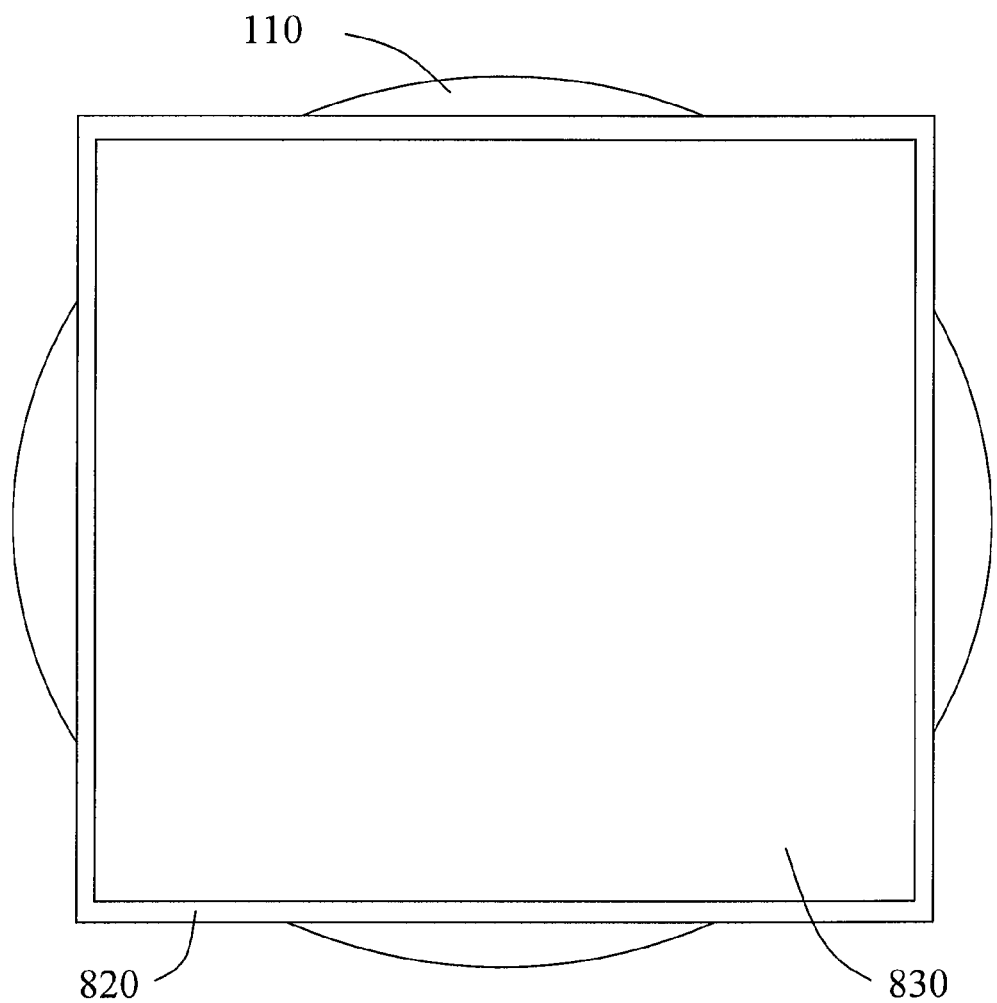
FIG. 8 shows a 300×300 $mm^2$ substrate holder for a single trimmed 450 mm wafer, according to embodiments of the invention.

FIG. 8 shows a 300×300 mm² substrate holder 820 for a single wafer/substrate 830. The holder is positioned on a susceptor 110, the susceptor having a diameter of approximately 356 mm. The holder has a diagonal of approximately 424 mm. The 300 mm dimensions of the holder allow for ease of passage through the limiting apertures of the processing system. Limiting apertures include loadlocks 614, as shown in FIG. 6. The substrate 830 may be a trimmed 450 mm wafer. Note that this arrangement provides approximately 27% greater substrate area for processing than for a regular 300 mm diameter wafer. Note that a substrate holder with rounded corners may also be used, as shown in FIG. 5; although, rounded corners would reduce the substrate area and may require trimming of the corners of a wafer carried on the substrate holder. Clearly, holders such as those of FIGS. 2 and 4 can also be configured for single wafers.

Although the present invention has been particularly described with reference to embodiments thereof, it should be readily apparent to those of ordinary skill in the art that changes and modifications in the form and details may be made without departing from the spirit and scope of the invention. It is intended that the appended claims encompass such changes and modifications. The following claims define the present invention.

What is claimed is:

1. A substrate holder comprising:
   a generally circular planar body, said body having greater than or equal to two pairs of diametrically opposed, parallel flat edges;
   wherein said substrate holder is configured to fit on a generally circular susceptor within a processing chamber, and wherein said substrate holder is configured to fit within the perimeter of said susceptor.

2. A substrate holder as in claim 1, wherein said body has four pairs of diametrically opposed, parallel flat edges, whereby said substrate holder is substantially octagonal.

3. A substrate holder as in claim 2, wherein said substrate holder is configured to carry a plurality of substrates.

4. A substrate holder as in claim 3, wherein said substrate holder carries twenty-eight 2 inch wafers and wherein said susceptor is approximately 14 inches in diameter.

5. A substrate holder as in claim 4, wherein said 2 inch wafers are arranged with each of their centers on one of four concentric circles.

6. A substrate holder as in claim 5, wherein said body has a plurality of recesses for capturing said plurality of substrates.

7. A substrate holder as in claim 4, wherein said substrate holder covers less than eighty percent of the susceptor area.

8. A substrate holder as in claim 3, wherein said substrate holder carries seven 4 inch wafers and wherein said susceptor is approximately 14 inches in diameter.

9. A substrate holder as in claim 8, wherein said substrate holder covers less than eighty percent of the susceptor area.

10. A substrate holder as in claim 3, wherein said substrates are separated by at least 1 millimeter.

11. A substrate holder as in claim 10, wherein said body has a plurality of recesses for capturing said plurality of substrates.

12. A substrate holder as in claim 3, wherein said substrate holder is configured to carry said plurality of substrates without any one of said plurality of substrates covering the center of said substrate holder.

13. A substrate holder as in claim 3, wherein said body has vacuum channels configured to hold said plurality of substrates in place when a vacuum is applied to said channels.

14. A substrate holder as in claim 3, wherein said body has a plurality of recesses for capturing said plurality of substrates.

15. A substrate holder as in claim 1, wherein said body is comprised of graphite coated with silicon carbide.

16. A substrate holder as in claim 1, wherein said body is configured to enable inductive heating of said substrate holder by said susceptor.

17. A substrate holder as in claim 1, wherein said body has a recess for capturing a substrate.

18. A substrate holder as in claim 17, wherein said body has apertures for lifting pins in said recess for assisting in removing said substrate from said substrate holder.

19. A substrate holder as in claim 1, wherein said substrate holder is configured to carry a single substrate, trimmed to fit said substrate holder, said single substrate covering greater than ninety percent of said substrate holder.

20. A substrate holder as in claim 19, wherein said substrate holder carries a trimmed 450 millimeter wafer and wherein said susceptor is approximately 14 inches in diameter.

21. A substrate holder as in claim 19, wherein said body has vacuum channels configured to hold said substrate in place when a vacuum as applied to said channels.

22. A substrate holder as in claim 19, wherein said body has a recess for capturing said substrate.

23. A substrate holder as in claim 1, wherein said body has three pairs of diametrically opposed, parallel flat edges, whereby said substrate holder is substantially hexagonal.

* * * * *